US009140732B2

(12) United States Patent
Tanaka et al.

(10) Patent No.: US 9,140,732 B2
(45) Date of Patent: Sep. 22, 2015

(54) ARC RESISTANCE PERFORMANCE EVALUATION DEVICE, ARC RESISTANCE PERFORMANCE EVALUATION SYSTEM, AND ARC RESISTANCE PERFORMANCE EVALUATION METHOD

(71) Applicant: KANEKA CORPORATION, Osaka-shi, Osaka (JP)

(72) Inventors: Yasunori Tanaka, Kanazawa (JP); Masahiro Ishida, Kanazawa (JP); Naoki Shinsei, Kanazawa (JP); Hiroyasu Hagi, Takasago (JP); Atsushi Mizobuchi, Osaka (JP)

(73) Assignee: KANEKA CORPORATION, Osaka-shi (JP)

( * ) Notice: Subject to any disclaimer, the term of this patent is extended or adjusted under 35 U.S.C. 154(b) by 159 days.

(21) Appl. No.: 13/871,253

(22) Filed: Apr. 26, 2013

(65) Prior Publication Data
US 2013/0241582 A1 Sep. 19, 2013

Related U.S. Application Data

(63) Continuation-in-part of application No. 13/839,269, filed on Mar. 15, 2013, now abandoned.

(30) Foreign Application Priority Data

Mar. 16, 2012 (JP) ................. 2012-060734

(51) Int. Cl.
G01R 27/02 (2006.01)
G01R 31/00 (2006.01)
G01R 31/12 (2006.01)

(52) U.S. Cl.
CPC ............ G01R 27/02 (2013.01); G01R 31/1218 (2013.01); G01R 31/1263 (2013.01)

(58) Field of Classification Search
CPC ...... C09D 4/00; C09D 189/00; C09D 5/1625; A41D 13/1281; B01J 19/088; B01J 2219/0894; B01J 2219/00159; B01J 2219/0896; C10K 3/001; G01R 27/02; G01R 31/1218; G01R 31/001; G01R 31/1263; H01J 1/02; H01J 1/13; H01J 1/30; H05H 1/24; H05H 1/2406; H05H 1/42; H05H 2001/2412; H05H 2001/2418; H05H 2245/124; F01N 2240/28; C03C 23/006; A42B 3/046; D06M 16/003; D10B 2501/04

See application file for complete search history.

(56) References Cited

U.S. PATENT DOCUMENTS 6,077,157 A 6/2000 Fairbairn et al.
6,949,735 B1 9/2005 Hatakeyama et al.

(Continued)

FOREIGN PATENT DOCUMENTS

JP 2003-244811 A 8/2003

OTHER PUBLICATIONS

M. Ishida et al., English translation of "Irradiated test of Ar, Ar+O2 and Ar + N2 thermal plasmas to flame retardant fibers.", 2011 Joint Symposium on Electrical Discharge, Switch Protection and High Voltage Engineering of the Institute of Electrical Engineers of Japan, Date of Presentation; Nov. 10, 2011, Date of distribution of pamphlet; Nov. 10, 2011.

(Continued)

Primary Examiner — Vinh Nguyen
(74) Attorney, Agent, or Firm — Westerman, Hattori, Daniels & Adrian, LLP

(57) ABSTRACT

The present device includes a high frequency induction thermal plasma generation unit 10; a second tube portion 20, which is connected to a first tube portion 13 and which includes window 25 on at least one side surface; and a testing subject installing pedestal 23 configured to be fixedly attached at a reference position in the second tube portion 20, wherein the testing subject installing pedestal 23 includes a seating portion for installing the testing subject 40, and a hold-down portion for fixing the installed testing subject 40 with a part of the testing subject exposed; and an ablated vapor generated from the testing subject is observed through the window from an outer side of the second tube portion.

22 Claims, 16 Drawing Sheets

(56) References Cited

U.S. PATENT DOCUMENTS

| | | | |
|---|---|---|---|
| 2004/0211899 A1 | 10/2004 | Ezumi et al. | |
| 2006/0042251 A1* | 3/2006 | Villalobos | 60/670 |
| 2006/0285108 A1 | 12/2006 | Morrisroe | |
| 2008/0239598 A1* | 10/2008 | Asokan et al. | 361/56 |
| 2014/0257723 A1* | 9/2014 | Lee et al. | 702/58 |

OTHER PUBLICATIONS

M. Ishida et al., English translation of "Estimation on Composition and Temperature of Ablated Vapor from Synthetic Fibers Irradiated by Thermal Plasmas.", 2012 Annual Meeting of the Institute of Electrical Engineers of Japan, Date of Presentation; Mar. 21, 2012, Date of distribution of pamphlet and CD-ROM; Mar. 5, 2012.

M. Ishida et al., English translation of "Polymer ablation phenomenon in Ar induction thermal plasma exposure on polymer fiber materials", Fiscal 2011 Hokuriku-Section Joint Convention of Institutes of Electrical Engineering, date of presentation; Sep. 17, 2011, date of distribution of CD-ROM; Sep. 17, 2011.

M. Ishida et al., "Estimation of composition and temperature of the ablation steam when thermal plasma is irradiated on synthetic fibers", Summary of Lecture at the Institute of Electrical Engineers of Japan National Meeting, date of publication of Website (program and summary); Feb. 1, 2012, w/English translation.

Ishida Masahiro et al., "Ablated phenomenon from Polymer Fibers Irradiated by Ar Thermal Plasmas.", 2011 Joint Conference of Hokuriku Chapters of Electrical Societies, Date of Presentation; Sep. 17, 2011, Date of distribution of CD-ROM; Sep. 17, 2011.

Ishida Masahiro et al., "Irradiated test of Ar, Ar+O2 and Ar + N2 thermal plasmas to flame retardant fibers.", 2011 Joint Symposium on Electrical Discharge, Switch Protection and High Voltage Engineering of the Institute of Electrical Engineers of Japan, Date of Presentation; Nov. 10, 2011, Date of distribution of pamphlet; Nov. 10, 2011.

Ishida Masahiro et al., "Estimation on Composition and Temperature of Ablated Vapor from Synthetic Fibers Irradiated by Thermal Plasmas.", 2012 Annual Meeting of the Institute of Electrical Engineers of Japan, Date of Presentation; Mar. 21, 2012, Date of distribution of pamphlet and CD-ROM; Mar. 5, 2012.

Ishida Masahiro et al., "Temperature estimation of ablated vapor from synthetic fibers irradiated by thermal plasmas.", 2012 Joint Symposium on Electrical Discharge, Static Apparatus and Switch Protection of the Institute of Electrical Engineers of Japan, Date of Presentation; Jun. 25, 2012, Date of distribution of pamphlet; Jun. 25, 2012.

Ishida Masahiro et al., "Ablated phenomenon from unmelting Synthetic Fibers Irradiated by Ar Thermal Plasmas.", 2012 Joint Conference of Hokuriku Chapters of Electrical Societies, Date of Presentation; Sep. 1, 2012, Date of distribution of CD-ROM; Sep. 1, 2012.

Ishida Masahiro et al., "Prompt response and durability of polymer ablation from synthetic fibers irradiated by thermal plasmas for arc resistant cloths.", 11th Asia Pacific Conference on Plasma Science and Technology, Date of Presentation; Oct. 2, 2012, Date of publication of Website; Oct. 2, 2012.

Ishida Masahiro et al., "Estimation on Temperature of Ablated Vapor from Heat-Resistant Synthetic Fibers Irradiated by Ar Thermal Plasmas.", 2013 Annual Meeting of the Institute of Electrical Engineers of Japan, Date of distribution of pamphlet and CD-ROM; Mar. 5, 2013(Expected date of Presentation; Mar. 20, 2013).

Office Action dated Feb. 5, 2015, issued in U.S. Appl. No. 13/839,269, (24 pages).

* cited by examiner

ARC RESISTANCE PERFORMANCE EVALUATION DEVICE, ARC RESISTANCE PERFORMANCE EVALUATION SYSTEM, AND ARC RESISTANCE PERFORMANCE EVALUATION METHOD

This application is a CIP of application Ser. No. 13/839,269, filed on Mar. 15, 2013, now abandoned.

This application claims priority under 35 U.S.C. §119 (a) on Japanese Patent. Application No. 2012-060734 filed in Japan on Mar. 16, 2012, the entire contents of which are hereby incorporated by reference.

A part of the present invention is disclosed by the inventors at study meetings below.

(1) ISHIDA Masahiro et al., "Ablated phenomenon from Polymer Fibers Irradiated by Ar Thermal Plasmas.", 2011 Joint Conference of Hokuriku Chapters of Electrical Societies, Date of Presentation; Sep. 17, 2011, Date of distribution of CD-ROM; Sep. 17, 2011.

(2) ISHIDA Masahiro et al., "Irradiated test of Ar, Ar+$O_2$ and Ar+$N_2$ thermal plasmas to flame retardant fibers.", 2011 Joint Symposium on Electrical Discharge, Switch Protection and High Voltage Engineering of the Institute of Electrical Engineers of Japan, Date of Presentation; Nov. 10, 2011, Date of distribution of pamphlet; Nov. 10, 2011.

(3) ISHIDA Masahiro et al., "Estimation on Composition and Temperature of Ablated vapor from Synthetic Fibers Irradiated by Thermal Plasmas.", 2012 Annual Meeting of the Institute of Electrical Engineers of Japan, Date of Presentation; Mar. 21, 2012, Date of publication of Website (program and summary); Feb. 1, 2012, Date of distribution of pamphlet and CD-ROM (briefing paper); Mar. 5, 2012.

(4) ISHIDA Masahiro et al., "Temperature estimation of ablated vapor from synthetic fibers irradiated by thermal plasmas,", 2012 Joint Symposium on Electrical Discharge, Static Apparatus and Switch Protection of the Institute of Electrical Engineers of Japan, Date of Presentation; Jun. 25, 2012, Date of distribution of pamphlet; Jun. 25, 2012.

(5) ISHIDA Masahiro et al., "Ablated phenomenon from unmelting Synthetic Fibers Irradiated by Ar Thermal Plasmas.", 2012 Joint Conference of Hokuriku Chapters of Electrical Societies, Date of Presentation; Sep. 1, 2012, Date of distribution of CD-ROM; Sep. 1, 2012.

(6) ISHIDA Masahiro et al., "Prompt response and durability of polymer ablation from synthetic fibers irradiated by thermal plasmas for arc resistant cloths.", 11th Asia Pacific Conference on Plasma Science and Technology, Date of Presentation; Oct. 2, 2012, Date of publication of Website; Oct. 2, 2012.

(7) ISHIDA Masahiro et al., "Estimation on Temperature of Ablated Vapor from Heat-Resistant Synthetic Fibers Irradiated by Ar Thermal Plasmas.", 2013 Annual Meeting of the Institute of Electrical Engineers of Japan, Date of distribution of pamphlet, and CD-ROM; Mar. 5, 2013 (Expected date of Presentation; Mar. 20, 2013).

BACKGROUND OF THE INVENTION

1. Field of the Invention

The present invention relates to arc resistance performance evaluation devices, arc resistance performance evaluation systems, and arc resistance performance evaluation methods, and in particular, to a device and a method for evaluating the arc resistance performance of a fiber material.

2. Description of the Related Art

In the United States, five to ten cases of arc flash accidents occur every day. Since the temperature of the arc is very high, namely approximately 5000K or higher, if such accidents once occur, it may lead to severe burns or fatal accidents in some cases. Thus, protective clothing having high arc resistance performance is desired to protect one's self from such an accident.

In developing such protective clothing, a detailed study on what kind of material to use for the clothing fabric needs to be carried out. To this end, the following method is considered one form of approach. Fibers of different materials are prepared, the fibers are irradiated with thermal flux under various conditions, and the reaction at the time is accumulated as data. The accumulated data are then analyzed to find the fiber material suited for the protective clothing.

In view of such an aspect, it can be recognized that the experiment of irradiating the fiber with thermal flux and obtaining the data needs to be conducted many times.

One example of a configuration of protective clothing having high arc resistance performance is disclosed in JP-A-2003-244811, for example.

SUMMARY OF THE INVENTION

JP-A-2003-244811 also describes an evaluation method that the developed clothing fabric demonstrates high arc performance. According to the document, an upper electrode and a lower electrode are arranged with an inter-electrode distance of 300 mm. A sample clothing fabric is installed, with the top and bottom fixed, at a place spaced apart by 200 mm in the horizontal direction from the electrodes. The temperature change at three areas on the back surface of the clothing fabric is measured with an arc discharge generated between the electrodes.

However, this method is not appropriate as a method for evaluating the arc resistance performance with respect to the fiber material to find the fiber material to be used for the clothing fabric for the following reasons.

In terms of finding an appropriate material, a plurality of types of fiber materials need to be irradiated with the thermal flux under the same condition, and furthermore, the same types of fiber materials need to be irradiated with the thermal flux while changing only a specific condition and fixing the other conditions to collect a great amount of data. That is, it is required that the same thermal flux irradiation state is stably achieved.

In addition, it is required that the experiment be conducted inexpensively through a simple method to collect a great amount of data.

As described in JP-A-2003-244811, when the arc discharge is generated between the two electrodes, the discharging mode may not stabilize due to the original properties (kink instability) of the arc. In other words, even if the irradiation of the thermal flux is conducted under the same condition while changing the material of the fiber serving as the sample to obtain the necessary data, the irradiation environment changes for each experiment due to the instability of the arc. Therefore, it is difficult to create an environment in which the irradiation of the thermal flux is conducted under the same condition, and the experiment is conducted enormous number of times, by necessity/in order to collect the data suited for analysis.

Furthermore, the arc discharging device is very expensive, and hence it is not easy to provide the arc discharging device on one's own, and even if one goes to the facility equipped with such a device to conduct the experiment, a great amount of expenses is required for one use. Thus, if is difficult in reality to conduct the experiment over a sufficient number of times.

In view of the problems, it is an object of the present invention to provide a device, a system, and a method for evaluating the arc resistance performance by irradiating the sample with the thermal flux stably and inexpensively under the same condition.

In order to achieve the above object, an arc resistance performance evaluation device according to the present invention includes a high frequency induction thermal plasma generation unit including a gas flow-in portion, a first tube portion connected to the gas flow-in portion, and an induction coil wound around an outer side of the first tube portion, a high frequency current being supplied to the induction coil with the first tube portion containing gas flowed in from the gas flow-in portion to generate plasma in the first tube portion; a second tube portion, which is connected to the first tube portion and which includes a window on at least one side surface; and a testing subject installing pedestal configured to be fixedly attached at a reference position in the second tube portion, wherein the testing subject installing pedestal includes a seating portion for installing the testing subject, and a hold-down portion for fixing the testing subject installed on the seating portion with a part of the testing subject exposed; and an ablated vapor generated from the testing subject is observed through the window from an outer side of the second tube portion with the testing subject installed on the testing subject installing pedestal irradiated with the plasma generated in the high frequency induction thermal plasma generation unit.

The present device achieves the plasma input at low voltage since the arc discharge is not used. Thus, a high voltage is not required and the device can be inexpensively obtained. Furthermore, the testing subject can be stably irradiated with thermal plasma without the problem of instability since the arc discharge is not used.

The testing subject in which the fiber material is processed to a pellet shape may be adopted for the testing subject to be installed on the testing subject installing pedestal. In this case, the structure in which the hold-down portion is arranged in the testing subject installing pedestal, and the testing subject is held down by the hold-down portion is obtained, and thus even when irradiated with the plasma thus causing ablation, the testing subject can be suppressed from lifting upward or dropping.

The testing subject installing pedestal preferably has a structure such that a distance with the first tube portion is adjustable while being inserted in the second tube portion. According to such a configuration, the magnitude of the irradiating thermal flux in a case where the testing subject is irradiated with the plasma generated in the first tube portion can be easily adjusted. The experiment thus can be easily conducted under various conditions.

Information on whether or not the ablated vapor is generated from the testing subject after a predetermined time from the setting of the testing subject at the reference position, a time required until the start of generation of the ablated vapor from the setting at the reference position, and the like can be obtained by photographing the ablated vapor generated by the testing subject through the window from the outer side of the second tube portion using the present device.

As will be described later in the examples, the ablated vapor is expected to have an effect of cooling the plasma temperature, and thus such information can be used to evaluate the arc performance. For example, when the clothing fabric is created with the material in which the ablated vapor is immediately generated, the effect of instantaneously cooling when the arc accident occurs is expected. When the above-described, material and the material in which the time required until the start of generation of the ablated vapor is long are combined to create the clothing fabric, the effect of achieving the cooling performance over a long time can foe expected.

In the present device, preferably at least one groove extending in the radial direction is formed in the hold-down portion of the testing subject installing pedestal, and the ablated vapor existing on an inner side of the hold-down portion is observed through the window and the groove from the outer side of the second tube portion.

In the present device, preferably, when the testing subject installing pedestal is set at the reference position with the testing subject installed, a part of the testing subject is exposed at a position extended in an axial direction from a center axis of the first tube portion. According to such a configuration, the testing subject can be reliably irradiated with the thermal plasma generated in the first tube portion.

In addition to the configuration described above, in the present device, preferably the second tube portion is connected to a lower side of the first tube portion; the seating portion is configured to install the testing subject on an upper surface; and the hold-down portion is configured to fix the testing subject installed on the seating portion with a part of the upper surface thereof exposed. According to such a configuration, the testing subject can be easily and stably installed on the testing subject installing pedestal.

In addition to the configuration described above, the present device may further include a pressure detecting unit for detecting pressure inside at least one of the first tube portion and the second tube portion; a gas flow-out portion that flows out gas from the second tube portion; a flow-out rate changing unit for changing the gas flow rate that flows out from the gas flow-out portion; and a controller for controlling the flow-out rate changing unit to change the gas flow rate that flows out based on the pressure detected by the pressure detecting unit.

In the present device, the gas flow-in portion may include a flow rate detecting part for detecting the gas flow rate that flows into the first tube portion, and a flow rate changing part for changing the gas flow rate that flows into the first tube portion; and the controller may control the flow rate changing part to change the gas flow rate that flows in based on the gas flow rate detected by the flow rate detecting part. According to such a configuration, the pressure inside the first tube portion and the second tube portion effectively stabilizes.

In addition, to the configuration described above, the present device may include a power detection unit for detecting power supplied to the induction coil; a power changing unit for changing power supplied to the induction coil; and a controller for controlling the power changing unit to change the power supplied to the induction coil based on the power detected by the power detection unit.

In addition to the present device described above, an arc resistance performance evaluation system can be achieved by including a photographing section, which is installed on the outer side of the second tube portion and configured to observe the inside of the second tube portion through the window; and an analysis processing section for performing spectrometric observation processing based on the photographed data obtained by the photographing section. According to such a configuration, with what kind of molecules the ablated vapor is configured can be specified.

The analysis processing section is preferably configured to have a function of fitting with a theoretical value calculated by calculation with respect to the analysis result. The rotation temperature and the vibration temperature of the ablated vapor are thus calculated, and the obtained temperatures and the plasma temperature are compared to evaluate the cooling effect of the ablated vapor.

The analysis processing section also preferably is configured to have a spectroscope to calculate a spectral shape based on the photographed data; an input part to input the rotation temperature or the vibration temperature; a memory part to memorize basic data to calculate the spectral shape; an operation part to calculate the spectral shape based on the rotation temperature or the vibration temperature inputted at the input part and the basic data memorized at the memory part; and a display part to display superimposing a spectral shape calculated at the spectroscope and a spectral shape calculated at the operation part.

In irradiating the testing subject with plasma using the present device, the process preferably includes: calculating an analyzed spectral shape based on the photographed data; inputting the rotation temperature or the vibration temperature; calculating a theoretical spectral shape based on the rotation temperature or the vibration temperature inputted; and displaying superimposition of the analyzed spectral shape and the theoretical spectral shape.

In irradiating the testing subject with plasma using the present device, it is also preferable to measure the mass difference of the testing subject between before irradiation and after irradiation of plasma. When the testing subject ablated by plasma irradiation, the mass of the testing subject reduces. Thus, the high and low of the ablation property can be evaluated by evaluating the mass wear amount for every material of the testing subject.

Upon evaluating the arc resistance performance of the testing subject using the present device, determination may be made on whether or not the pressure inside at least one of the first tube portion and the second tube portion is in a constant state, and the testing subject installing pedestal installed with the testing subject may be set at the reference position when determined that the pressure is in the constant state.

Upon evaluating the arc resistance performance of the testing subject using the present device, determination may be made on whether or not the pressure inside at least one of the first tube portion and the second tube portion is in a constant, state, determination may be made on whether or not the gas flow rate that flows into the first tube portion is in a constant state, and the testing subject installing pedestal installed with the testing subject may be set at the reference position when determined that the pressure is in the constant state and the gas flow rate is in the constant state.

Upon evaluating the arc resistance performance of the testing subject using the present device, determination may be made on whether or not the power supplied to the induction coil is in a constant state, and the testing subject installing pedestal installed with the testing subject may be set at the reference position when determined that the power is in the constant state.

When evaluating the arc resistance performance of the testing subject using the present device, various types of gases can be used for the gas (sheath gas) that flows in from the gas flow-in portion. For example, the pare arc resistance performance can be evaluated under the condition of only the thermal flow by using the Ar gas, and the arc resistance performance as well as the flame resistance performance can be evaluated by the mixed gas of Ar and $O_2$. Furthermore, the arc resistance performance in the atmosphere can be evaluated by the mixed gas of Ar and $N_2$.

According to the configuration of the present invention, the sample can be irradiated stably and inexpensively with the thermal flux under the same condition without using an unstable arc to evaluate the arc resistance performance.

DETAILED DESCRIPTION OF THE PREFERRED EMBODIMENTS

Arc resistance performance evaluation device, system, and method of the present invention will be described with reference to the drawings. Hereinafter, such a device, system, and method may be abbreviated as "present device", "present system", and "present method".

[System Configuration]

The configuration of the present system will be described.

[Overall Configuration]

Figure 1:
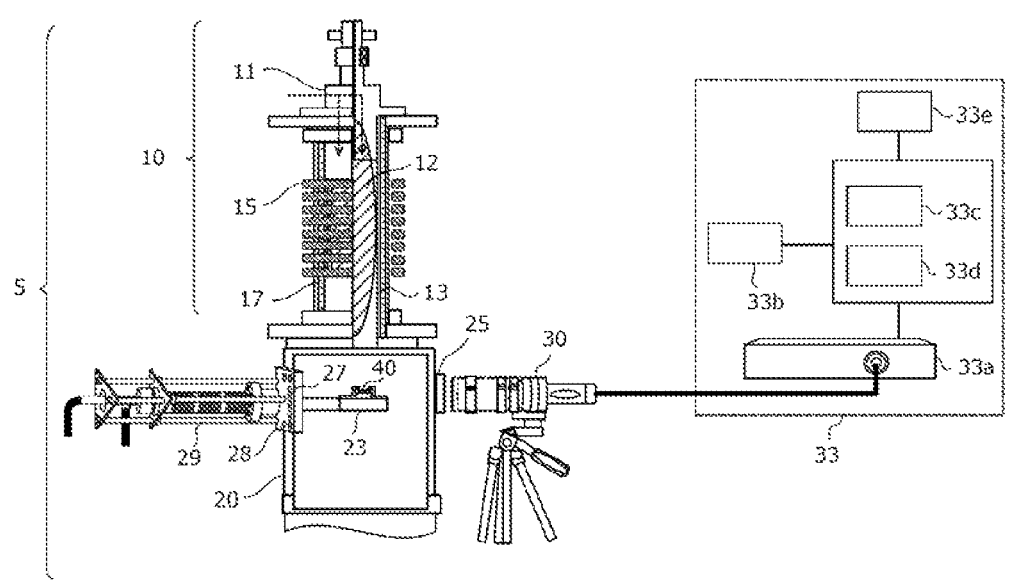
FIG. 1 is a schematic view showing a configuration of an arc resistance performance evaluation system.

FIG. 1 is a schematic view showing a configuration of the present system. The present system 1 includes a present device 5, which includes a high frequency induction thermal plasma generation unit 10, a testing subject installing pedestal 23, and the like; a photographing section 30, and an analysis processing section 33.

The present system 1 is configured to irradiate the testing subject with the thermal plasma in the present device 5, photograph the aspect thereof with the photographing section 30, and analyze the photographed result with the analysis processing section 33. The present device 5 is configured to irradiate the testing subject with the high frequency induction thermal plasma (Inductively Coupled Thermal Plasma; ICTP) in place of the arc plasma.

[High Frequency Induction Thermal Plasma Generation Unit]

The high frequency induction thermal plasma generation unit 10 includes a gas flow-in portion 11, a first tube portion 13 connected to the gas flow-in portion 11, and an induction coil 15 wound around the outer side of the first tube portion 13. When high frequency current is supplied to the induction coil 15 with the first tube portion 13 containing gas that flowed in from the gas flow-in portion 11, thermal plasma 12 can be generated in the first tube portion 13.

The first tube portion 13 more specifically has a double tube structure, where cold water for cooling can be flowed through a gap portion 17 provided, between an inner tube and an outer tube. As one example, the first tube portion 13 is configured with a double tube structure of a cylindrical quarts tube having an inner diameter of 70 mm$\phi$, an outer diameter of 95 mm$\phi$, and a length of 330 mm. The first tube portion 13 is cooled from the heating of the plasma by flowing the cold water through the gap portion 17.

The first tube portion 13 has the induction coil 15 wound around the outer side for a plurality of turns. As one example, the induction coil 15 is wound eight turns. When the high frequency current is supplied to the induction coil 15, an alternating magnetic field generates in the axial direction inside the first tube portion 13. This magnetic field induces an alternating electric field in the radial direction inside the first tube portion 13. When a predetermined sheath gas is flowed in from the gas flow-in portion 11 in this state, the gas is excited and ionized in the first tube portion 13 thus generating the thermal plasma. The high frequency current, caused by the alternating electric field flows through the generated thermal plasma, and the thermal plasma is stably maintained in the first tube portion 13.

The conventional arc resistance performance evaluation device includes two electrodes spaced apart from each other, and generates the arc plasma by flowing the current in the axial direction (inter-electrode direction). In the present system 1, on the other hand, the ICTP is used instead of the arc plasma, and thus the thermal plasma can be stably generated without arising the problem of kink instability.

[Testing Subject Installing Pedestal]

A second tube portion 20 serving as a testing subject installing space is formed on a lower side of the high frequency induction thermal plasma generation unit 10. The second tube portion 20 includes a window 25 for observing the inside from the outside, and an insertion opening 27 for inserting the testing subject installing pedestal 23 to the inner side from the outer side.

Figure 2:
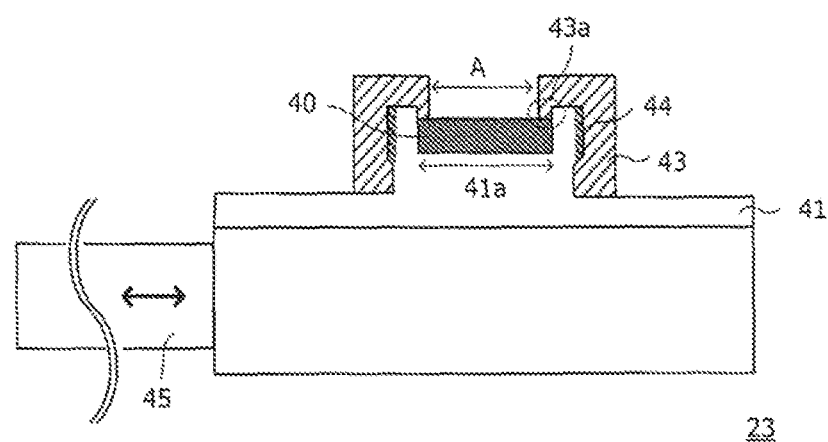
FIG. 2 is a cross-sectional schematic view showing a configuration of a testing subject installing pedestal.
Figure 3:
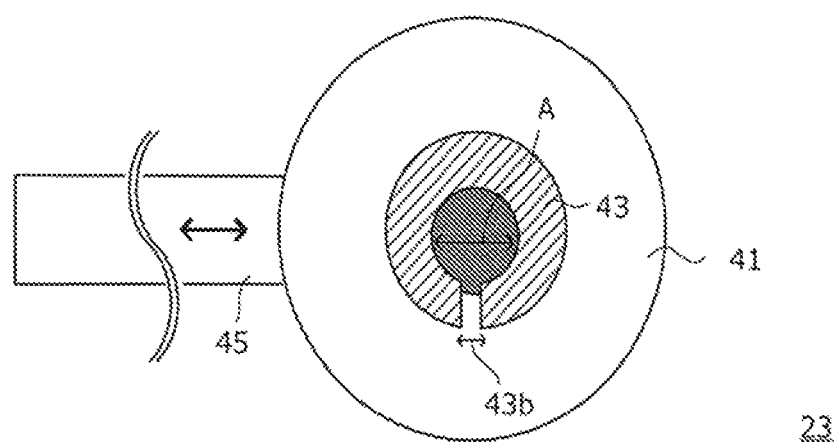
FIG. 3 is a plan schematic view showing a configuration of the testing subject installing pedestal.

FIG. 2 shows a cross-sectional schematic view showing the testing subject installing pedestal 231b an enlarged manner. FIG. 3 shows a plan schematic view showing the testing subject installing pedestal 23 in an enlarged manner. The testing subject installing pedestal 23 includes a seating portion 41 for installing the testing subject 40 serving as the sample on the upper surface, and a hold-down portion 43 for holding down the testing subject 40 installed on the seating portion 41. The seating portion 41 and the hold-down portion 43 are configured as separate components, and can be coupled through a coupling member 44 such as a screw.

The testing subject installing pedestal 23 also includes an extensible slide portion 45.

The procedure for installing the testing subject 40 on the testing subject installing pedestal 23 is as follows. First, in the pre-stage of inserting into the second tube portion 20, the testing subject 40 is set in a predetermined area of the seating portion 41 of the testing subject installing pedestal 23. In the present embodiment, a groove portion 41a having an inner side surface and a bottom surface is formed at the upper surface of the seating portion 41, so that the testing subject 40 can be set in the groove portion 41a. The shape of the seating portion 41 is not limited to such a configuration.

The hold-down portion 43 is then coupled to the seating portion 41 from the upper side. In the present embodiment, a hook 43a is formed in the hold-down portion 43, and the hook 43a makes contact with the upper surface of the peripheral edge of the testing subject 40 when the hold-down portion 43 and the seating portion 41 are coupled with the testing subject 40 set. That is, the testing subject 40 is prevented from lifting upward since the hook 43a holds down the testing subject 40 from the upper side. The exposure of an upper surface portion A of the testing subject 40 is still ensured since the hook 43a makes contact with the testing subject 40 at the peripheral edge of the testing subject 40a.

After setting the testing subject 40 in such a manner, the testing subject installing pedestal 23 is inserted into the second tube portion 20 from the insertion opening 27. At this time, the slide portion 45 extends in the radial direction of the second tube portion 20, so that, the testing subject installing pedestal 23 can be set at a predetermined position (reference position) in the second tube portion 20. Such a reference position is preferably immediately below the first tube portion 13. The testing subject 40 thus can be reliably irradiated with the thermal plasma generated in the first tube portion 13.

In FIG. 1, the slide portion 45 of the testing subject installing pedestal 23 is fixed to a base 28, and the insertion opening 27 is to be shielded by the base 28. A water cooling mechanism 29 is arranged on the back side of the base 28 (side opposite to the testing subject installing pedestal 23), so that the testing subject installing pedestal 23 can be cooled. The testing subject installing pedestal 23 may be made ox stainless steel, by way of example. The testing subject installing pedestal 23 has a structure to withstand the heating by the thermal plasma irradiation by being cooled by the water cooling mechanism 29.

One or a plurality of groove portions 43b extending in the radial direction is formed in the hold-down portion 43. At least one groove portion 43b is formed to face the direction of the photographing section 30 when the testing subject installing pedestal 23 is set at the reference position. The groove portion 43b ensures the optical path for photographing the testing subject 40 from, the photographing section 30.

Although not illustrated, the present device 5 includes a suction unit on a lower side of the second tube portion 20, so that vapor inside the second tube portion 20 can foe suctioned before the start of or after the end of the thermal plasma irradiation.

[Photographing Section]

The photographing section 30 can photograph the situation inside the second tube portion 20 through the window 25. The height of the photographing section 30 is set to be substantially the same as the height of the testing subject installing pedestal 23, so that the situation of the testing subject 40 installed on the testing subject installing pedestal 23 can be observed by the photographing section 30. As described above, the groove portion 43b is formed in the hold-down portion 43, and hence the situation of the testing subject 40 positioned on the inner side of the hold-down portion 43 can be observed through the groove portion 43b.

A color high-speed video camera system can be used, by way of example, for the photographing section 30. As will be described later, when the fiber material is used for the testing subject 40 and the thermal plasma 12 is applied by the first tube portion 13, the ablated vapor is discharged from the testing subject 40 according to the material. The photographing section 30 photographs the generation mode of the ablated vapor from the testing subject 40.

[Analysis Processing Section]

The analysis processing section 33 acquires various information through calculation processing based on the generation mode of the ablated vapor from the testing subject 40 photographed by the photographing section 30. In the present embodiment, the analysis processing section 33 includes a spectroscope 33a, and can analyze the composition of the vapor by spectral analysing the photographed ablated vapor. Furthermore, a theoretical spectral shape corresponding to the electron state, the vibration state, and the rotation state of the predicted constituent molecule may be prepared in advance, and the fitting processing with the spectral shape actually obtained from the photographing result may be performed to calculate the vibration temperature and the rotation temperature of the constituent molecule in the analysis processing section 33.

The analysis processing section 33 includes an input part 33b (keyboard, mouse, etc) to input the vibration temperature or the rotation temperature, and a memory part 33c to memorize basic data (calculation formula, etc) to calculate the spectral shape. The analysis processing section 33 also includes an operation part 33d to calculate the spectral shape based on the rotation temperature or the vibration temperature inputted at the input part 33b and the basic data memorized at the memory part 33c.

The analysis processing section 33 can further include a display part 33e to display an analyzed spectral shape (see, for example, FIGS. 8-13) calculated at a spectroscope 33a and a theoretical spectral shape calculated at a operation part 33d. The display part 33e displays the analyzed spectral shape and the theoretical spectral shape in superimposition. Then an analyzing per son can determine a theoretical spectral shape which coincides or corresponds the most with the analysed spectral shape (fitting processing), and assess the vibration temperature or the rotation temperature of the constituent molecule.

Instead of having the analyzing person to determine, in the present device 5, the operation part 33d can determine the theoretical spectral shape meet set conditions and have the display part 33e to display the theoretical spectral shape superimposing with the analysed spectral shape. The conditions to set can include a maximum overlapping area with the analysed spectral shape in a certain wavelength range, etc.

[Plasma Control]

Figure 4:
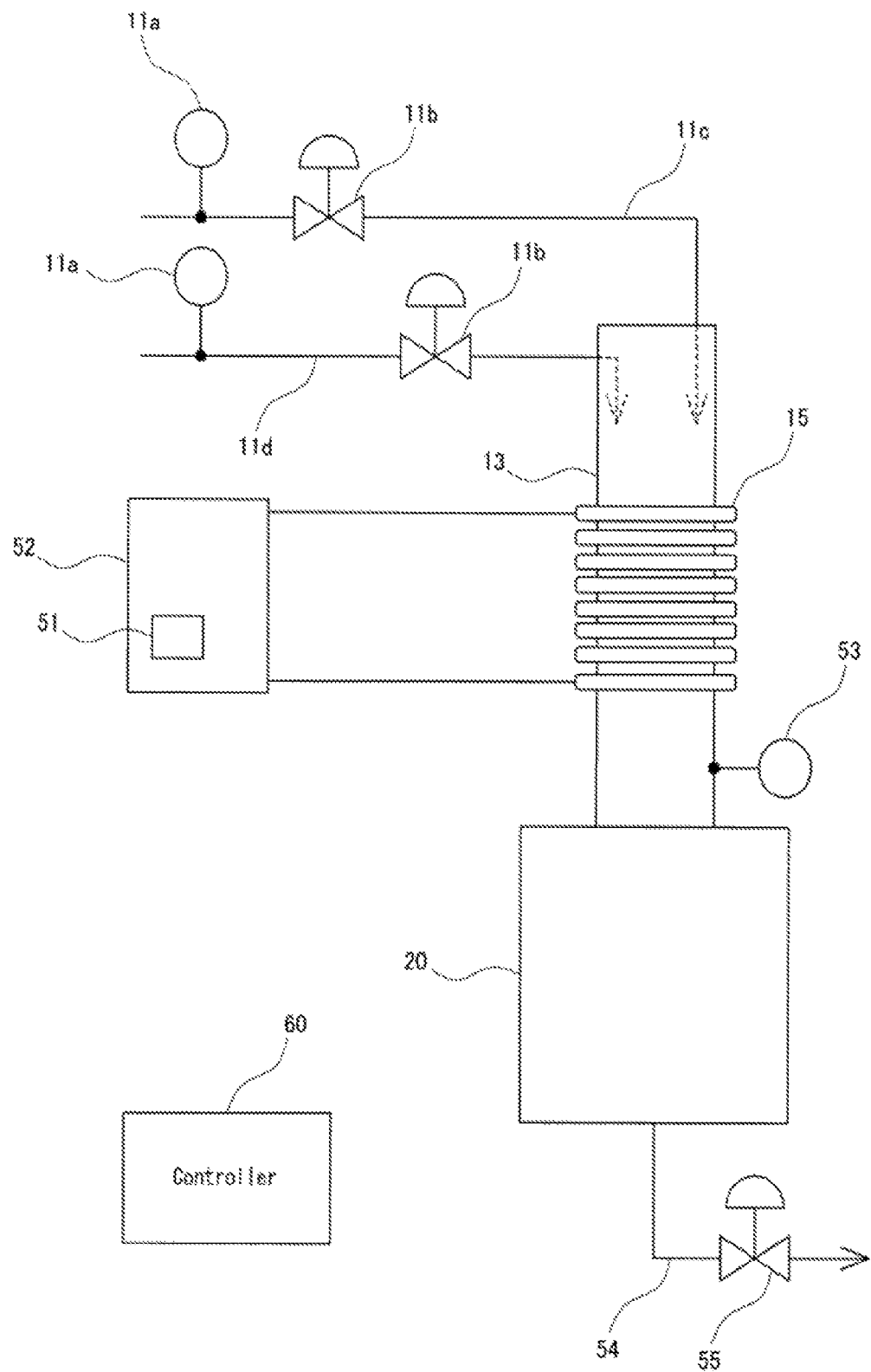
FIG. 4 is a schematic view showing a configuration of an arc resistance performance evaluation device.

The present device 5 performs the control so that the thermal plasma 12 stabilises. The content of control will be hereinafter described with reference to FIG. 4.

The gas flow-in portion 11 includes a flow rate detecting part 11a for detecting the gas flow rate that flows into the first tube portion 13, and a flow rate changing part 11b for changing the gas flow rate that flows into the first tube portion 13. In the present embodiment, the gas flow-in portion 11 includes an external radius gas flow-in part 11c that flows in the external radius gas, and an external rotation gas flow-in part 11d that flows in the external rotation gas. The external radius gas is gas that flows in the axial direction of the first tube portion 13 along the inner wall of the first tube portion 13. The external rotation gas is gas that flows in a spiral form about the axial direction of the first tube portion 13 along the inner wall of the first tube portion 13.

The present device 5 includes a power detecting unit 51 for detecting power supplied to the induction coil 15, and a power changing unit 52 for changing the power supplied to the induction coil 15. The present device 5 also includes a pressure detecting unit 53 for detecting the pressure of the inside at least one of the first tube portion 13 and the second tube portion 20, a gas flow-out portion 54 that discharges the gas from the second tube portion 20, and a flow-out amount changing unit 55 for changing the gas flow rate that flows out from the gas flow-out portion 54. The present device 5 also includes a controller 60 for performing a control to maintain the plasma in the stable state.

The flow rate detecting part 11a is arranged at each of the gas flow-in parts 11c and 11d. The flow rates detecting part 11a detects the flow rate of each of the gas flow-in parts 11c and 11d. The flow rate detecting part 11a outputs the detected, flow rate to the controller to, and also displays the detected flow rate value.

The controller 60 controls the flow rate changing part 11b based on the flow rate detected by the flow rate detecting part 11a so that the flow rate of each of the gas flow-in parts 11c and 11d becomes a constant state (state in which the flow rate value is maintained within the set range). Specifically, the flow rate changing part 11b is a flow adjusting valve, and the controller 60 controls the opening of the flow rate changing part 11b.

The power detecting unit 51 detects the power supplied to the induction coil 15. The power detecting unit 51 outputs the detected power to the controller 60, and also displays the detected power value. The controller 60 controls the power changing unit 52 based on the power detected by the power detecting unit 51 so that the power supplied to the induction coil 15 becomes a constant state (state in which the power value is maintained within the set range).

The pressure detecting unit 53 detects the pressure inside the first tube portion 13. The pressure detecting unit 53 outputs the detected pressure to the controller 60 and also displays the detected pressure value. The controller 60 controls the flow-out rate changing unit 55 so that the pressure inside the first tube portion 13 becomes a constant state (state in which the pressure value is maintained within the set range). Specifically, the flow-out rate changing unit 55 is a flow adjusting valve, and the controller 60 controls the gas flow rate discharged from, the gas flow-out portion 54 by controlling the opening of the flow-out rate changing unit 55.

[Testing Subject]

The testing subject 40 is deformed to a mode in which the fiber material serving as a sample can be set on the testing subject installing pedestal 23. More specifically, the fiber material molded to a pellet shape is used for the testing subject 40. A tablet molding device may be used for the molding method, by way of example.

[Evaluation Method]

Figure 5:
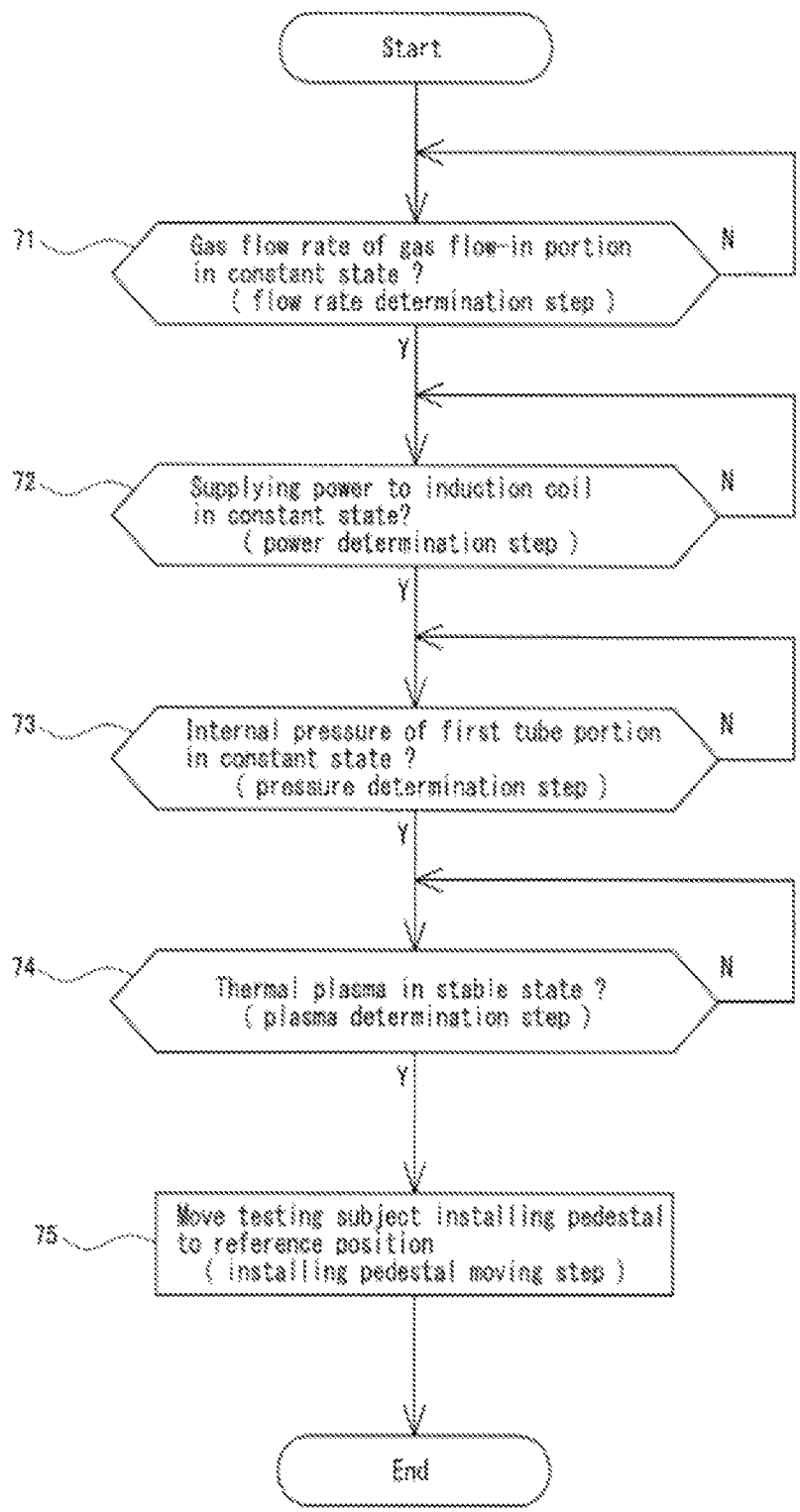
FIG. 5 is a flowchart of the arc resistance performance evaluation.

As shown in FIG. 5, the flow rate of the gas flowing to each of the gas flow-in part 11c and 11d is checked with the flow rate detecting part 11a, and whether or not a first requirement, in which the flow rate of each of the gas flow-in part 11c and 11d is in a constant state, is satisfied is determined (flow rate determination step 71). Then, the power supplied to the induction coil 15 is checked with the power detecting unit 51, and whether or not a second requirement, in which the power supplied to the induction coil 15 is in a constant state, is satisfied is determined (power determination step 72).

The pressure inside the first tube portion 13 is cheated with the pressure detecting unit 53, and whether or not a third requirement, in which the pressure inside the first tube portion 13 is in a constant state, is satisfied is determined (pressure determination step 73). Furthermore, the state of the thermal plasma 12 is checked from the outer side of the first tube portion 13, in which the inside is visible, and whether or not a fourth requirement, in which the thermal plasma 12 is in a stable state, is satisfied is determined (plasma determination step 74). For example, determination is made as the stable state when swinging of the light emission of the thermal plasma 12 is small and the thermal plasma 12 does not make contact with the inner wall of the first tube portion 13.

If all four requirements are satisfied, the slide portion 45 is extended in the radial direction in the second tube portion 20 to move the testing subject installing pedestal 23 to the reference position in the second tube portion 20 (installing pedestal moving step 75). The testing subject 40 arranged at the reference position is irradiated with the thermal plasma to perform the arc resistance performance evaluation.

The arc resistance performance evaluation includes checking whether or not the ablated vapor is generated from the testing subject after a predetermined time from the setting at the reference position, measurement of the time required until the start of generation of the ablated vapor from the setting at the reference position, the measurement of the molecular composition configuring the ablated vapor, and the measurement of the mass wear amount from comparison, of the mass difference of the subject between before and after the plasma irradiation.

[Condition Setting]

The achievement of an environment identical to that in the conventional arc resistance test using the present device 5 (present system 1) will be hereinafter described.

As described above, in the present device 5, the testing subject 40 is irradiated with the ICTP as the thermal plasma. The ICTP belongs to the "thermal plasma", similar to the arc plasma. The features of the thermal plasma are that the pressure is relatively high, namely about the atmospheric pressure, the electron temperature is substantially equal to the gas temperature, the temperature of the gas particles is very high, namely a few thousand to a few tens of thousands K, and the like.

NFPA 70E (National Fire Protection Association 70E) defines the standard, for testing the arc resistance. According to the NFPA 70E, it is required that the sample be irradiated with the thermal flux of between 84 and 25120 kW/m$^2$. Thus, whether the irradiation of the thermal flux under the condition can also be carried out in the present device 5 is verified.

Figure 6:
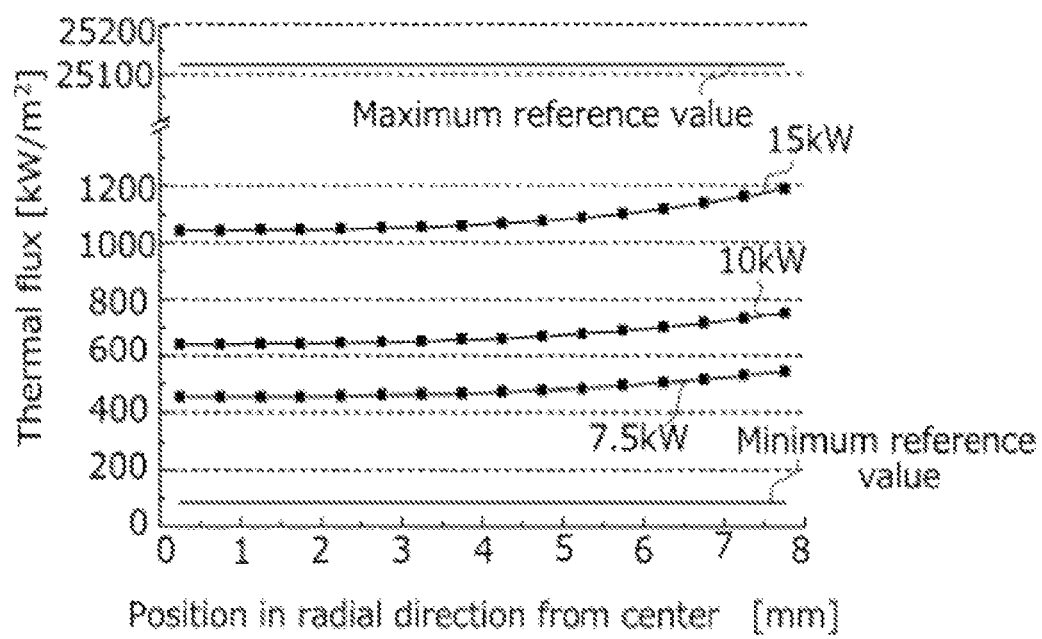
FIG. 6 is a graph comparing the thermal fluxes in the arc test and the ICTP irradiation in the present system.

FIG. 6 is a graph comparing the thermal fluxes in the arc test and the ICTP irradiation in the present device 5. FIG. 6 shows a radial temperature distribution of the thermal flux in the second tube portion 20, which is 63 mm on the lower side from the bottom surface of the first tube portion 13, when the gas (sheath gas) to be flowed in from the gas flow-in portion 11 is Ar and the input power is 7.5 kW, 10 kW, and 15 kW in the present system 5. As shown in FIG. 6, the thermal flux when the input power is 7.5 kW is about 450 kW/m$^2$, the thermal flux when the input power is 10.0 kW is about 650 kW/m$^2$, and the thermal flux when the input power is 15.0 kW is about 1050 kW/m$^2$, which are all within the baseline level. Therefore, it is confirmed that when the input power is between 7.5 and 15 kW, the thermal flux that can be irradiated is within the baseline level of the arc test.

As seen from above, the arc resistance performance evaluation test can be conducted by irradiating the testing subject 40 with the thermal plasma generated in the first tube portion 13 by the present device 5.

In the embodiment described above, the second tube portion 20 is arranged on the lower side of the high frequency induction thermal plasma generation unit 10 including the first tube portion 13, and the thermal plasma 12 is applied to the testing subject 40 from the upper side to the lower side. However, if the testing subject 40 can be stably held on the testing subject installing pedestal 23, the thermal plasma 12 does not necessarily need to be applied from, the upper side.

For example, the testing subject 40 may be installed on the testing subject installing pedestal 23 such that, the exposing surface of the testing subject 40 is in a vertical direction with respect to the horizontal surface, and the thermal plasma 12 may be applied from the horizontal direction.

In this case, the seating portion 41 is configured so that the testing subject 40 can be installed, and the hold-down portion 43 is configured to fix the testing subject 40 installed on the seating portion 41 while exposing one part thereof. The testing subject 40 does not necessarily need to be installed on the upper surface of the seating portion 41. The testing subject 40 installed on the seating portion 41 and fixed by the hold-down portion 43 does not necessarily need to have the upper surface exposed, and merely needs to have one part exposed.

In the case of such a configuration, the "reference position" does not need to foe immediately below the first tube portion 13. In other words, the position relationship in which one part of the testing subject 40 is exposed at a position extended in the axial direction from a center axis of the first tube portion 13 is to be obtained when the testing subject installing pedestal 23 is set at the "reference position" with the testing subject 40 installed. The testing subject 40 can foe reliably irradiated with the thermal plasma generated in the first tube portion 13 by setting the "reference position" in such a manner.

However, the second tube portion 20 is preferably arranged on the lower side of the first tube portion 13 because the testing subject 40 can be easily and stably installed on the testing subject installing pedestal 23.

EXAMPLES

A method for actually evaluating the arc resistance performance using the present device 5 (present system 1) will be described with reference to the examples.

[Experiment Conditions]

A double tube structure of a cylindrical quarts tube having an inner diameter of 70 mm$\phi$, an outer diameter of 95 mm$\phi$, and a length of 330 mm was adopted for the first tube portion 13. The testing subject installing pedestal 23 was set at a position 200 mm on the lower side of the induction coil 15. The induction coil 15 had eight turns.

The diameter of the conductor of the induction coil 15 is 14 mm. The induction coil 15 is formed by winding the conductor in a spiral, form. The distance from the upper end to the lower end of the induction coil 15 is 155 mm, and the outer diameter of the induction coil is 132 ram.

Assuming Ar is the sheath gas, the plasma input power was set to 8.54 kW (corresponding to thermal flux of about 550 kW/m$^2$), the sheath gas flow rate was set to 30 slpm, and the pressure in the first tube portion 13 was set to the atmospheric pressure (760 Torr).

The sheath gas adopts the external radius gas and the external rotation gas. The external radius gas is 15 slpm, and the external rotation gas is 15 slpm.

A fiber material including each of materials described below was compressed to a pellet form having a diameter of 11 mm and a thickness of 3.5 mm to be used for the testing subject 40, which is the target to be irradiated with plasma. More specifically, a tablet molding device (for diameter of 10 mm) (manufactured by JASCO Corporation) was used with respect to 0.20 g of fiber material to pressurize the fiber material for 60 to 180 seconds under the pressure of 55 to 65 MPa using an electrical hydraulic pump, thus molding the fiber material to a tablet form having a diameter of 11±1 mm and a thickness of 3.5±1 mm.

In the testing subject installing pedestal 23, the diameter of the opening formed at the inner edge of the hook 43a of the hold-down portion 43 is 9 mm. Thus, a circular portion having a diameter of 9 mm in the upper surface portion A of the testing subject 40 is exposed. The width of the groove portion 43b of the hold-down portion 43 is 4 mm.

The high speed color video camera (VW-6000 manufactured by Keyence Corporation) was used for the photographing section 30, where the photographing condition included frame rate of 1000 fps, and 256×256 pixcel$^2$ per an observation area of 50 mm×50 mm. The photographing started with the start of irradiation of the thermal plasma 12 on the testing subject 40, and the photographing time was 20 seconds.

The analysis processing section 33 included a spectroscope (high speed multi-channel spectroscope PMA-20, manufactured by Hamamatsu Photonics K.K.). The spectrometric observation start time was after elapse of 20 seconds from the start of irradiation, the exposure time was 19 msec, and the measurement time was one second. The measurement position was a position 2 mm to the upper side from the upper surface of the testing subject 40 in the axial direction and the center of the testing subject 40 in the radial direction.

The following was used for the fiber material configuring the testing subject 40 in examples 1 to 6.

Example 1

In the example 1, the fiber material of acryl-vinylidene chloride copolymerization system expressed, with the chemical formula $[-(C_3H_3N)_1-(C_2H_2Cl_2)_m-]_n$ was used for the testing subject 40. This material is known by the name Kanecaron (manufactured by Kaneka Corporation, and registered trademark of Kaneka Corporation).

Example 2

In the example 2, the fiber material in which antimony oxide is mixed to the material of the example 1 was used for the testing subject 40. This material is known by the name Protex (manufactured by Kaneka Corporation, and registered trademark of Kaneka Corporation).

Example 3

In the example 3, the fiber material of phenol series expressed with the chemical formula $[-C_{88}H_{58}O_3-]_n$ was used for the testing subject 40. This material is known by the name Kynol (manufactured by Gunei Chemical Industry Co., Ltd., and registered trademark of Gunei Chemical Industry Co., Ltd.).

Example 4

In the example 4, the fiber material of para-aramid series expressed with the chemical formula $[-C_{10}H_8O_4-]_n$ was used for the testing subject 40. This material is known by the name Twaron (manufactured by Teijin Aramid B.V., and registered trademark of Teijin Aramid B.V.).

Example 5

In the example 5, the fiber material of polyethylene series expressed with the chemical formula $[-C_{12}H_{22}O_2N_2-]_n$ was used for the testing subject 40. This material is known by the name Tetoron (manufactured by Toray Industries Inc., and registered trademark of Toray Industries Inc.).

Example 6

In the example 6, the fiber material of nylon series expressed with the chemical formula $[-C_{14}H_{10}O_2N_2-]_n$ was used for the testing subject 40. This material is known by the name Promilan (manufactured by Toray Industries Inc., and registered trademark of Toray Industries Inc.).

The testing subject installing pedestal 23 is inserted into the second tube portion 20 from the insertion opening 27, and positioned at a standby position. This standby position was the position 200 mm to the lower side front the lower end of the induction coil 15, and the position 80 mm in the radial direction from the center axis of the first tube portion 13. When the plasma was struck with the testing subject installing pedestal 23 positioned at the standby position, the ablated vapor was not confirmed in all the testing subjects 40 of the examples 1 to 6.

When the slide portion 45 extends in the radial direction in the second tube portion 20 after the present device 5 satisfies the four requirements and stably operates, the testing subject installing pedestal 23 moves to the reference position in the second tube portion 20. The reference position in the present experiment was the position 200 mm to the lower side from, the lower end of the induction coil 15 and the position immediately below the center axis of the first tube portion 13 (corresponding to thermal flux of about 550 kW/m$^2$).

When the plasma was struck with the testing subject installing pedestal 23 set at the reference position, the ablated vapor was confirmed in the testing subjects 40 of the examples 1, 2, 3, 5 and 6. This indicates that the minimum thermal flux (boundary value) for reaching the generation of the ablated vapor exists. Therefore, the ablated vapor does not generate when the testing subject installing pedestal 23 is positioned at the standby position, and the ablated vapor generates when the testing subject installing pedestal 23 is positioned at the reference position.

[State]

Figure 7:
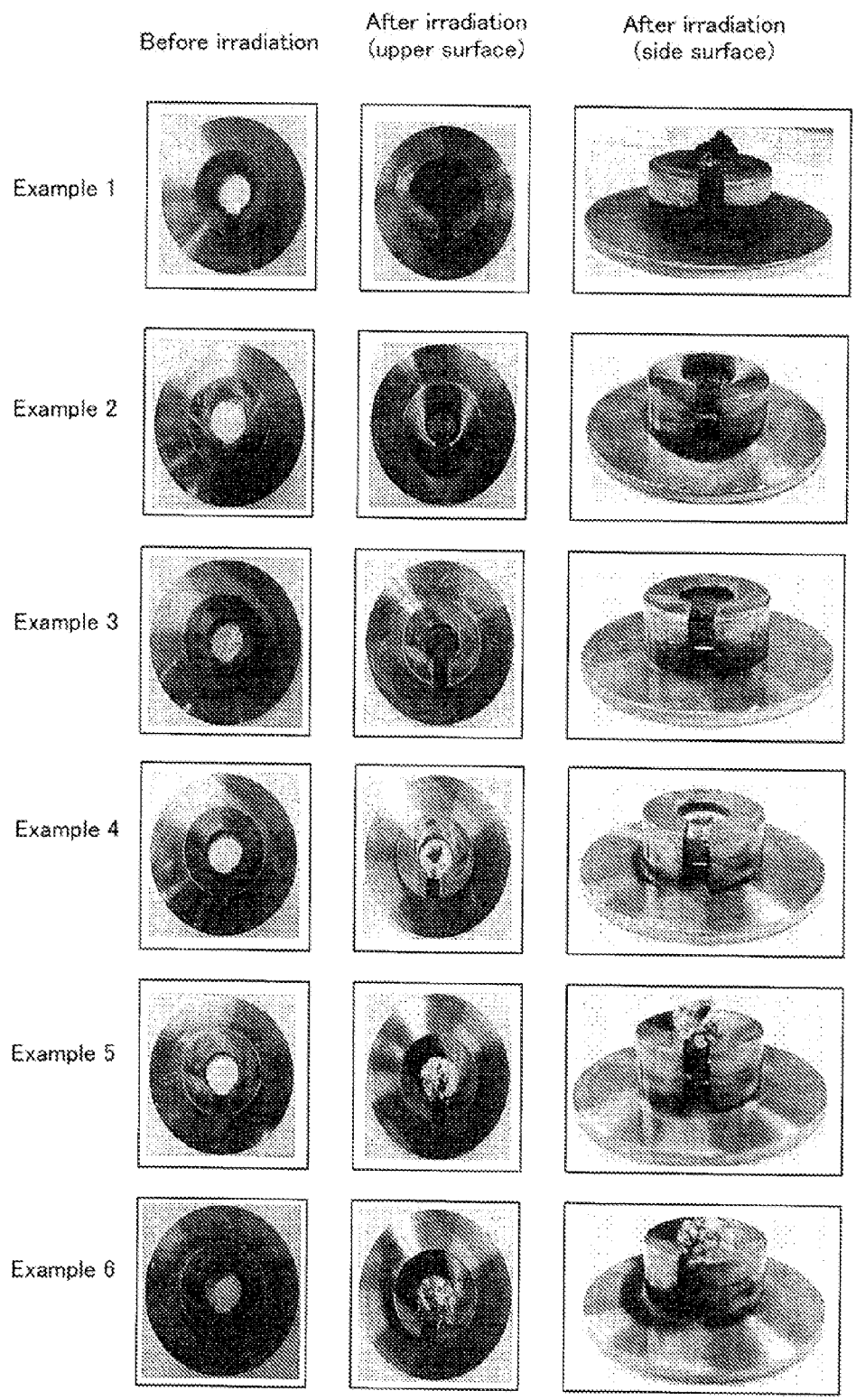
FIG. 7 show pictures of a testing subject before and after the ICTP irradiation in respective examples.

FIG. 7 shows, next to pictures before the irradiation, pictures of the testing subject 40 after irradiation in the case where the testing subject 40 configured with the material of each example is irradiated with the thermal plasma under the experiment conditions described above with the sheath gas as Ar. In the examples 1 and 2, the fibers configuring the testing subject 40 contracted after the irradiation. In particular, in the example 1, the fiber contracted in the radial direction and stretched in the axial direction.

In the examples 3 and 4, no change was found in the fiber shape for before and after the irradiation. In the example 3, the entire surface burnt, but in the example 4, a slight burn was found at a center portion.

In both examples 5 and 6, the fiber expanded after the irradiation, and in particular, spreading in the axial direction was confirmed. In both examples, a great number of holes were found as if air bubbles erupted.

In the photographing section 30, the following modes were confirmed with respect to respective examples.

In all examples except for the example 4, generation of vapor that emits bluish-white light was observed. In the example 3, an aspect in which the bluish-white vapor strongly erupted immediately after the start of irradiation was observed, but the eruption receded after about one second from the start of irradiation. In the example 2, on the other hand, it took about 17 seconds for the emitting vapor to erupt, but thereafter, an aspect in which the vapor strongly erupted was observed.

In the examples 1 and 6 as well, an aspect in which the vapor strongly erupted, was observed. In these examples, the emission of the vapor was confirmed from immediately after the start of irradiation, and the strongly erupting vapor was observed even after elapse of 20 seconds.

The above results are shown in table 1 and table 2. In table 1, the modes of vapor generation during the 20 seconds from the start of irradiation are compared, and in table 2, the modes of vapor generation after elapse of 20 seconds are compared.

TABLE 1

| | Example 1 | Example 2 | Example 3 | Example 4 | Example 5 | Example 6 |
|---|---|---|---|---|---|---|
| Ablated vapor | Present | Present | Present | Not present | Present | Present |
| Ablation start time | After about 0.4 second | After about 11 seconds | Immediately after irradiation | None | After about 1 second | Immediately after irradiation |
| Brightness of vapor | 6 | 3 | 6 | 0 | 4 | 7 |
| Amount of vapor | Great | Small | Great | Not present | small | Great |

TABLE 2

| | Example 1 | Example 2 | Example 3 | Example 4 | Example 5 | Example 6 |
|---|---|---|---|---|---|---|
| Ablated vapor | Present | Present | Not present | Not present | Present | Present |
| Brightness of vapor | 6 | 6 | 0 | 0 | 5 | 7 |
| Amount of vapor | Great | Great | Not present | Not present | Medium | Great |

In table 1 and table 2, the detected amount of light was evaluated in eight stages of 0 to 7 with respect to the brightness of vapor.

According to table 1, immediate response of vapor eruption was recognised in the examples 1, 3, and 6. According to table 2, the continuousness of vapor eruption was recognized in the examples 1, 2, and 6. Therefore, according to the present system 1, the difference in modes after the irradiation of thermal plasma can be evaluated in accordance with the material.

[Spectrometric Observation Result]

Figure 8:
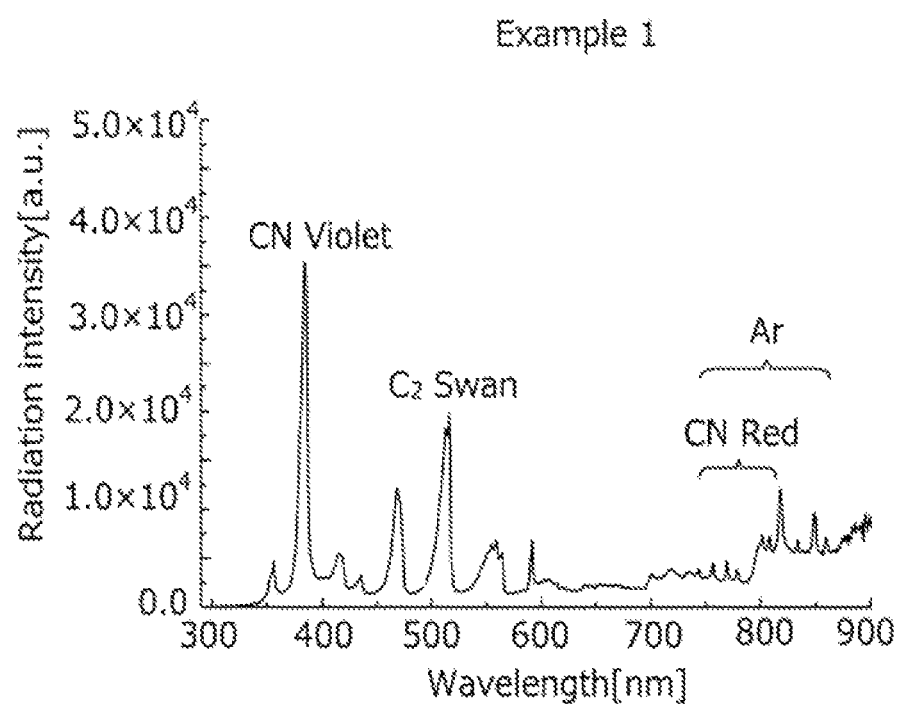
FIG. 8 is a view showing a spectrometric observation result with respect to vapor emission in an example 1.
Figure 9:
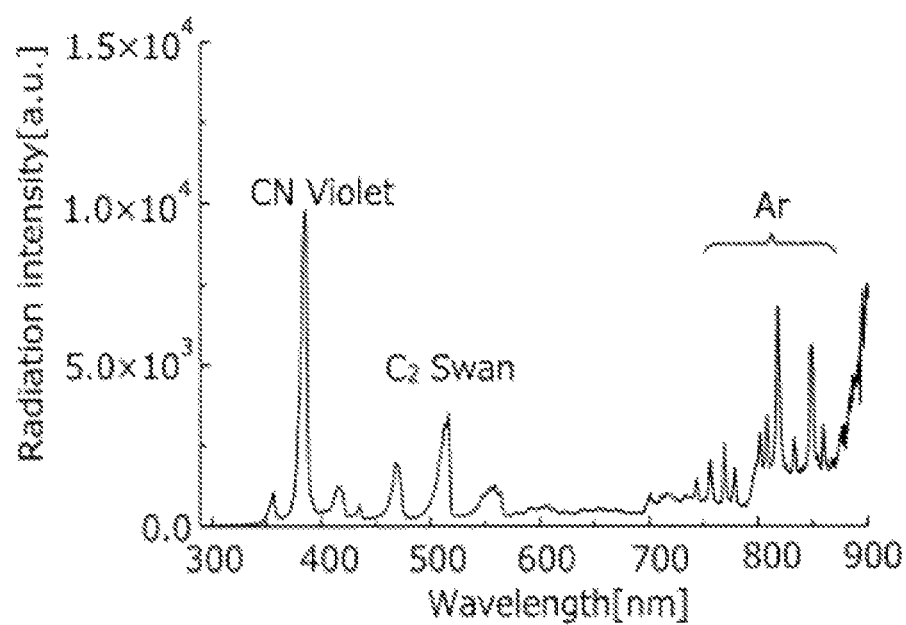
FIG. 9 is a view showing a spectrometric observation result with respect to vapor emission in an example 2.
Figure 10:
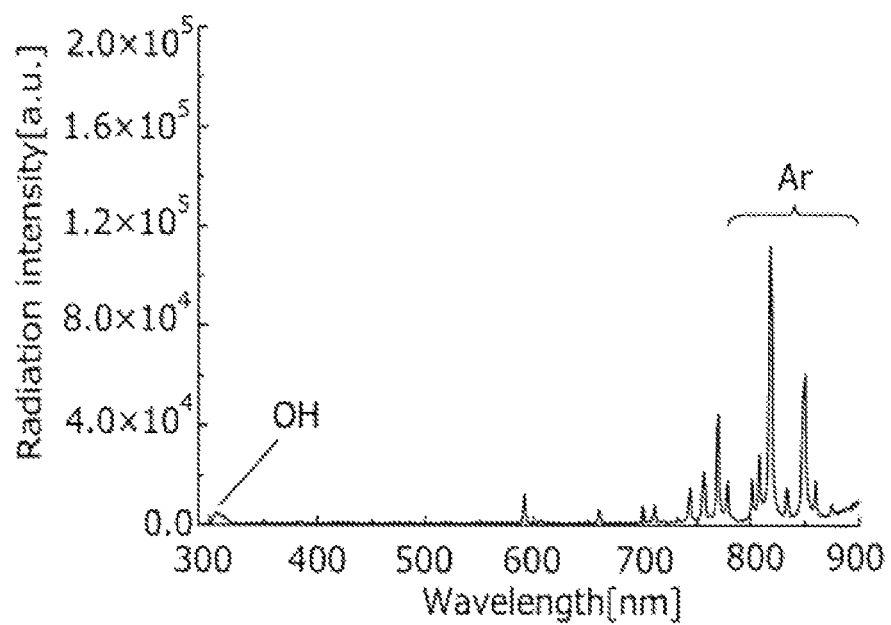
FIG. 10 is a view showing a spectrometric observation result with respect to vapor emission in an example 3.
Figure 11:
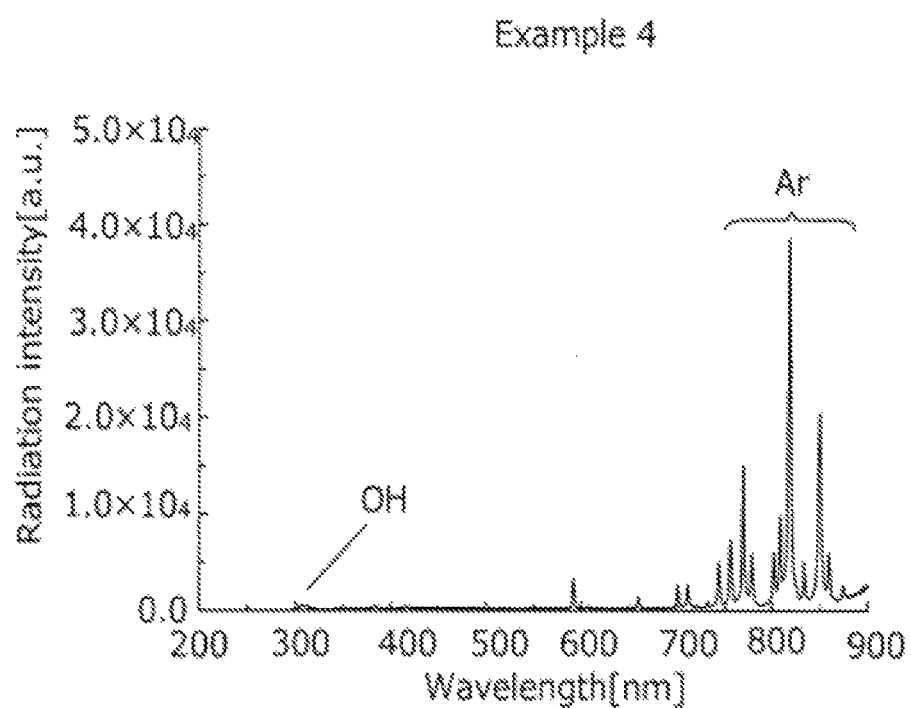
FIG. 11 is a view showing a spectrometric observation result with respect to vapor emission in an example 4.
Figure 12:
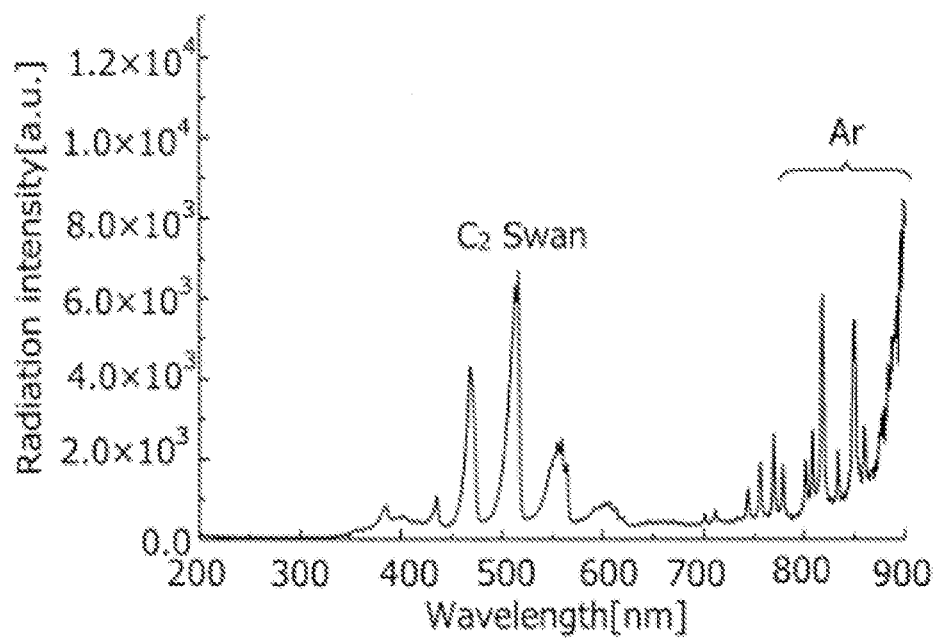
FIG. 12 is a view showing a spectrometric observation result with respect to vapor emission in an example 5.
Figure 13:
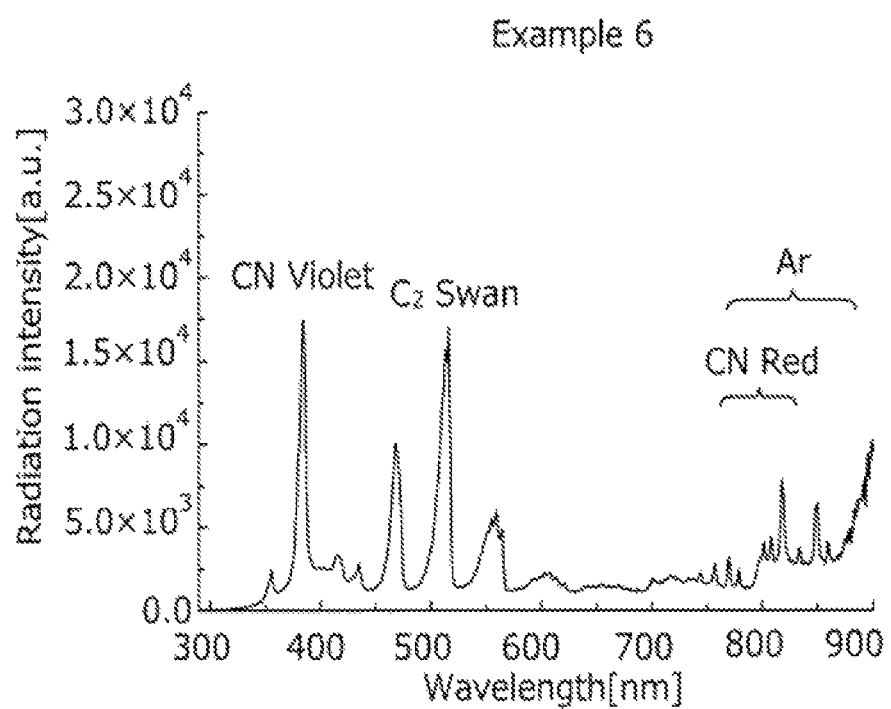
FIG. 13 is a view showing a spectrometric observation result with respect to vapor emission in an example 6.

FIGS. 8 to 13 show the result of performing spectrometric observation, with the analysis processing section 33, on the vapor emission from the testing subject 40 configured with the materials of the examples 1 to 6 when Ar is used for the sheath gas. FIG. 8 shows the result of the example 1, FIG. 9 shows the result of the example 2, FIG. 10 shows the result of the example 3, FIG. 11 shows the result of the example 4, FIG. 12 shows the result of the example 5, and FIG. 13 shows the result of the example 6.

According to FIGS. 8 to 13, $C_2$ Swan molecular spectrum and CN Violet molecular spectrum were detected in the examples 1, 2, and 6. In the examples 1 and 6, CN Red molecular spectrum was detected. In the example 5, CN Swan molecular spectrum was detected. In the examples 3 and 4, OH molecular spectrum was detected.

Therefore, it can be recognized that the constituent molecular of the ablated vapor generated at the time of thermal plasma irradiation can be specified in the analysis processing section 33 of the present system 1.

[Temperature Detection by Fitting]

The fitting with the theoretical calculation value of the $C_2$ Swan molecular spectrum and the CN Violet molecular spectrum was carried out in the analysis processing section 33 based on the results of FIGS. 8 to 13 to calculate the rotation temperature and the vibration temperature. The results are shown in FIGS. 14 and 15.

Figure 14:
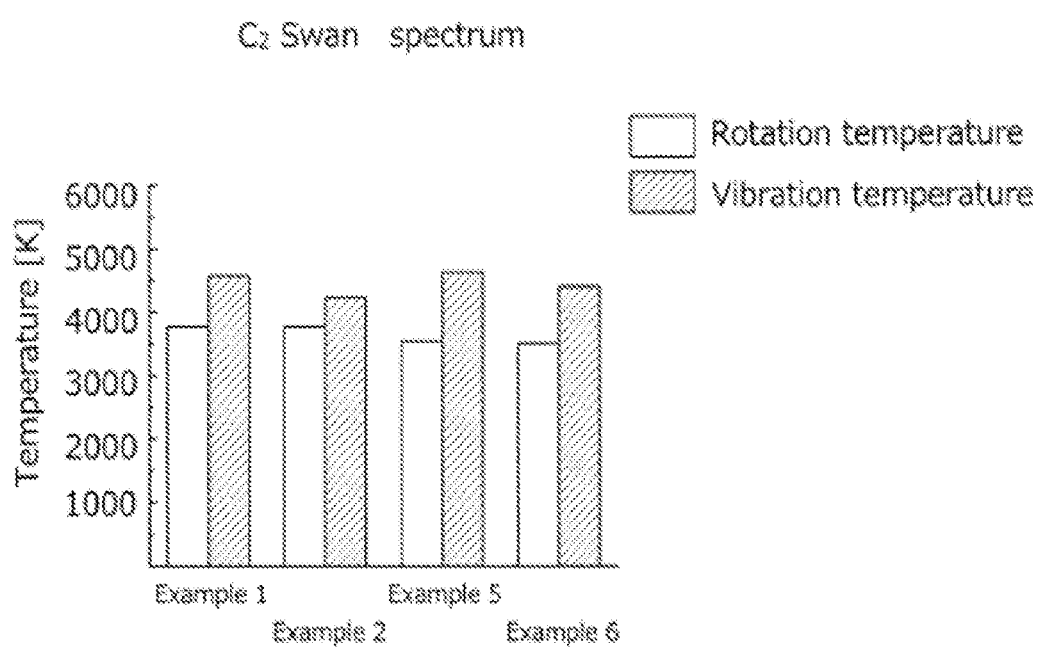
FIG. 14 is a view showing a calculation result of the rotation temperature and the vibration temperature of a $C_2$ Swan molecule.
Figure 15:
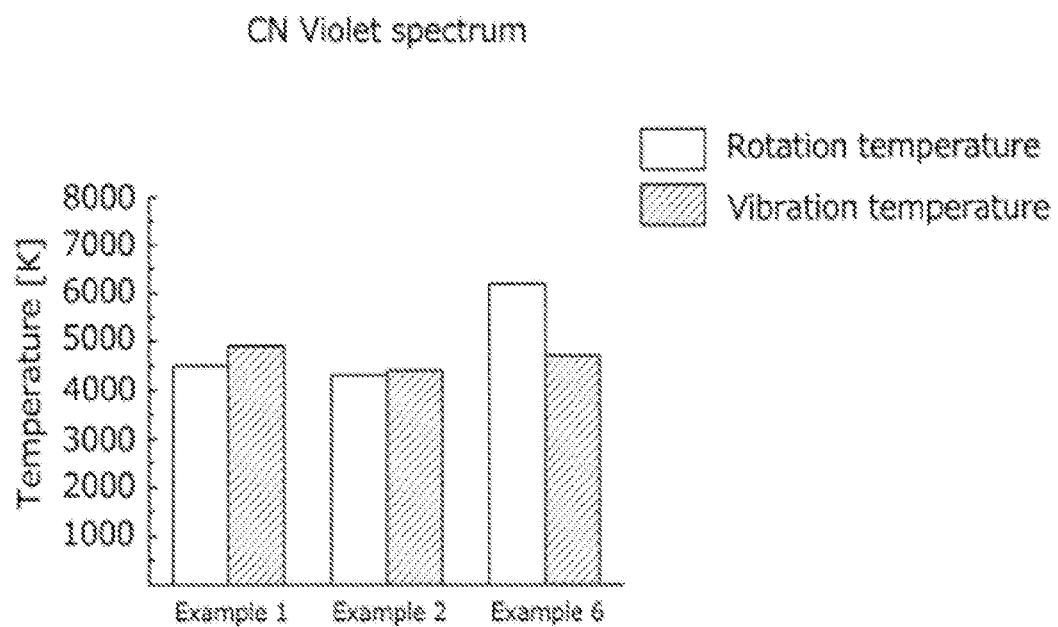
FIG. 15 is a view showing a calculation result of the rotation temperature and the vibration temperature of a CN Violet molecule.

According to FIG. 14, the rotation temperature of the $C_2$ Swan molecule was analyzed to be between 3500 and 3800K, and the vibration temperature was analyzed to be between 4300 and 4700K. According to FIG. 15, the rotation temperature of the Ca Violet molecule was analyzed to be between 4300 and 6200K, and the vibration temperature was analyzed to be between 4400 and 4900K. These temperatures are all values lower than the irradiated thermal plasma temperature, which is 8000K, by greater than or equal to 1000K. That is, it can be recognised from the results that the observed vapor has cooling effect.

The temperature (8000K) of the irradiated thermal plasma was estimated from the argon excitation temperature of the plasma. Specifically, the spectrum of the plasma was analysed by the analysis processing section 33 without the testing subject 40 installed and with the present device 5 stably operating, and a double ray intensity ratio method was used from the obtained Ar atom spectrum to estimate the temperature of the thermal plasma.

[Measurement of Mass Wear Amount]

The mass wear amount of the testing subject 40 caused by the thermal plasma irradiation was measured for the examples 1 to 6. Specifically, the weight of the testing subject installing pedestal 23 with the testing subject 40 set was measured at a stage before the irradiation of the thermal plasma. Then, after the irradiation of the thermal plasma, the weight of the testing subject installing pedestal 23 with the testing subject 40 set was measured in a state removed with tin, which deposited on the testing subject installing pedestal 23. The difference is the mass wear amount caused by the thermal plasma irradiation.

Figure 16:
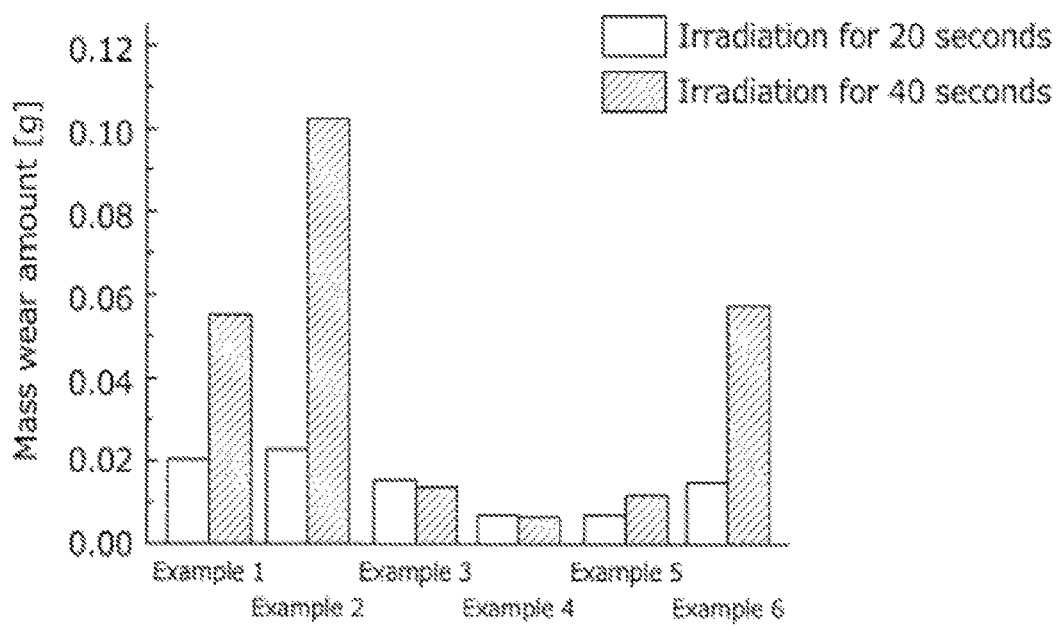
FIG. 16 is a view comparing mass wear amounts by thermal plasma irradiation in the examples 1 to 6.

In FIG. 16, the mass wear amounts of the examples 1 to 6 in a case where the irradiation time of the thermal plasma is 20 seconds and 40 seconds were compared. According to the results, it is presumed that the ablation phenomenon is occurring after elapse of a certain time from the irradiation of the thermal plasma in the fiber material of the example 2, which presumption accords with the results of table 1 and table 2.

In the examples described above, Ar was used for the sheath gas, but a mixed gas of Ar and $O_2$, a mixed gas of Ar and $N_2$, and the like may be used.

When using the mixed gas of Ar and $O_2$ for the sheath gas, the input power is 10.7 kW (corresponding to thermal flux of 550 kW/m$^2$), the Ar gas flow rate is 50 slpm, and the $O_2$ gas flow rate is 2.5 slpm, by way of example. The testing subject 40 of the examples 1 to 6 was irradiated with the thermal plasma under such experiment conditions.

In the examples 1, 3, 4, and 6, it was observed that the vapor emitting orange light is generating after the irradiation. In the examples 3 and 4, the brightness of the vapor was the brightest, and the time until the start of emission was short. In the examples 1, 2, and 5, the generation of vapor emitting white light was observed. In the example 2, the orange vapor was not observed and only white vapor was observed.

In the examples 1, 5, and 6, a burning aspect was observed at an upper part of the surface of the testing subject 40. In these examples, a black-body spectrum was observed as a result of performing spectrometric observation in the analysis processing section 33. This spectrum is observed when tin, and the like burns. Thus, in these examples, it is presumed that the burning reaction is occurring. In the examples 2, 3, and 4, on the other hand, the black-body radiation was not detected, and thus evaluation can be made that the materials are materials that are less likely to cause the burning reaction, that is, materials having high resistance to burning.

When using the mixed gas of Ar and $N_2$ for the sheath gas, the input power is 11.8 kW (corresponding to thermal flux of 550 kW/m$^2$), the Ar gas flow rate is 50 slpm, and the $N_2$ gas flow rate is 1.5 slpm, by way of example. The testing subject 40 of the examples 1 to 6 was irradiated with the thermal plasma under such experiment conditions.

In all the examples, the generation of the vapor emitting purple light after the irradiation was observed. In the examples 1, 3, 4, and 6, eruption of the purple ablated vapor was observed immediately after the irradiation. In the examples 3 and 4, orange light was discharged at the upper part of the surface of the testing subject 40 immediately after the irradiation, and then the purple emission immediately became the main emission. In the example 6, a bluish-white light was discharged at the upper part of the surface of the testing subject 40 immediately after the irradiation, and then the purple emission immediately became the main emission.

In the example 3, the observed purple emission weakened after one second from the start of irradiation, and orange emission was observed at the upper part of the surface of the testing subject 40. In the example 4 as well, the orange emission was similarly observed. In the examples 1, 3, 4, and 6, the ablated vapor was observed immediately after the irradiation, but in the examples 2 and 5, the ablated vapor was observed after elapse of two seconds from the start of irradiation.

During the irradiation of 20 seconds, an aspect in which the bluish-white colored bright ablated vapor is strongly erupting so as to cover the testing subject installing pedestal 23 from the testing subject 40 was observed in the examples 1, 3, and 6. In the examples 3 and 6, the vapor was strongly erupting at substantially the same time as the start of irradiation, and hence the respective materials are presumed to have high immediate response of ablation. In the example 3, the ablation was strong only immediately after the start of irradiation, and in the example 1, it took about five seconds until the start of strong ablation. In the example 6, an aspect in which the strong ablation started immediately after the start of irradiation, and the strong ablation lasted even after elapse of 20 seconds was observed. Thus, the material of the example 6 is presumed to be a material having high immediate response and high continuousness.

CONCLUSION

The state of the fiber after irradiation of plasma can be examined by performing irradiation of the high frequency induction plasma while changing the material of the fiber material to use for the testing subject 40 through the use of the present device and the present system. In particular, the ablation mode corresponding to the material can be evaluated.

Since an effect of lowering the temperature of the back surface can be expected if the vapor generated by ablation covers the testing subject 40, the material having high immediate response to ablation phenomenon and the material having high continuousness are thus found to be suitable for the clothing fabric of the protective clothing having high arc resistance performance. Furthermore, the mass wear amount is greater the more the material strongly causes the ablation phenomenon. Thus the high and low of the ablation property can be evaluated by examining the mass wear amount.

The present device 5 uses the ICTP, and hence the plasma input voltage can be realised at a lower voltage than the arc discharging device. Thus, high voltage is not required, and the device can be inexpensively obtained. Furthermore, since the arc plasma is not used, the problem of instability does not arise, and the testing subject can be stably irradiated with the thermal plasma.

The testing subject can be evaluated while changing the thermal plasma generating environment by changing the sheath gas that flows in from the gas flow-in portion 11. For example, the pure arc resistance performance can foe evaluated under the condition of only the thermal flow by using the Ar gas, and the arc resistance performance as well as the flame resistance performance can be evaluated by the mixed gas of Ar and $O_2$. Moreover, the arc resistance performance in the atmosphere can be evaluated by the mixed gas of Ar and $N_2$.

In the embodiment described above, the fiber material compressed to a pellet form is used for the testing subject 40. However, the fiber material is not the sole case, and a spun yarn, a cloth, or a cut cloth may be subjected to similar processing to be used for the testing subject 40.

The fiber materials of the testing subject 40 used in the examples are merely an example, and the evaluation of the arc resistance performance can be carried out through similar method regardless of what material is used to configure the testing subject.

In the embodiment described above, the first requirement, in which the flow rate of each of gas flow-in parts 11*a* and 11*b* is in a constant state, the second requirement, in which the power supplied to the induction coil 15 is in a constant state, the third requirement, in which the pressure inside the first tube portion 13 is in a constant state, and the fourth requirement, in which the thermal plasma 12 is in a stable state, are determined by humans. However, the present invention is not limited to such a configuration.

For example, the controller 60 may foe configured to make at least one of the four determinations. In particular, the controller 60 may perform all the four determinations, and automatically move the testing subject installing pedestal 23 with the slide portion 45 when all four requirements are satisfied.

In the embodiment described above, the four determinations are performed when the testing subject installing pedestal 23 is moved, but this is not the sole case, and at least one of the four determinations may be determined, for example. The order of making the determination is not particularly limited.

In the embodiment described above, the pressure detecting unit 53 detects the pressure inside the first tube portion 13. However, the present invention is not limited to such a configuration. For example, in the present invention, the pressure detecting unit 53 may detect the pressure inside the second tube portion (cavity) 20 or the pressure detecting unit 53 may detect the pressure in both the first tube portion 13 and the second tube portion 20.

What is claimed is:

1. An arc resistance performance evaluation device comprising:
   a high frequency induction thermal plasma generation unit including a gas flow-in portion, a first tube portion connected to the gas flow-in portion, and an induction coil wound around an outer side of the first tube portion, a high frequency current being supplied to the induction coil with the first tube portion containing gas flowed in from the gas flow-in portion to generate plasma in the first tube portion;
   a second tube portion, which is connected to the first tube portion and which includes a window on at least one side surface; and a testing subject installing pedestal configured to be fixedly attached at a reference position in the second tube portion, wherein the testing subject installing pedestal includes a seating portion for installing a testing subject, and a hold-down portion for fixing the testing subject installed on the seating portion with a part of the testing subject exposed; and an ablated vapor generated from the testing subject is observed through the window from an outer side of the second tube portion with the testing subject installed on the testing subject installing pedestal irradiated with the plasma generated in the high frequency induction thermal plasma generation unit.

2. The arc resistance performance evaluation device according to claim 1, wherein the testing subject installing pedestal is configured to install the testing subject in a pellet form on the seating portion, and fix the testing subject by the hold-down portion with an upper side of the testing subject exposed.

3. The arc resistance performance evaluation device according to claim 1, wherein the second tube portion includes an insertion opening for inserting the testing subject installing pedestal to an inner side from an outer side;

the testing subject installing pedestal is configured to be freely extendable; and the insertion opening is shielded in a state where the testing subject installing pedestal is inserted to the inner side from the outer side of the second tube portion.

4. The arc resistance performance evaluation device according to claim 3, wherein the testing subject installing pedestal is configured such that a distance with the first tube portion is adjustable while being inserted in the second tube portion.

5. The arc resistance performance evaluation device according to claim 1, wherein the hold-down portion includes at least one groove extending in a radial direction; and the ablated vapor existing on an inner side of the hold-down portion is observed through the window and the groove from the outer side of the second tube portion.

6. The arc resistance performance evaluation device according to claim 1, wherein when the testing subject installing pedestal is set at the reference position with the testing subject installed, a part of the testing subject is exposed at a position extended in an axial direction from a center axis of the first tube portion.

7. The arc resistance performance evaluation device according to claim 6, wherein the second tube portion is connected to a lower side of the first tube portion;

the seating portion is configured to install the testing subject on an upper surface; and the hold-down portion is configured to fix the testing subject installed on the seating portion with a part of the upper surface thereof exposed.

8. The arc resistance performance evaluation device according to claim 1, further comprising:

a pressure detecting unit for detecting pressure inside at least one of the first tube portion and the second tube portion;

a gas flow-out portion that flows out gas from the second tube portion;

a flow-out rate changing unit for changing the gas flow rate that flows out from the gas flow-out portion; and a controller for controlling the flow-out rate changing unit to change the gas flow rate that flows out based on the pressure detected by the pressure detecting unit.

9. The arc resistance performance evaluation device according to claim 8, wherein the gas flow-in portion includes a flow rate detecting part for detecting the gas flow rate that flows into the first tube portion, and a flow rate changing part for changing the gas flow rate that flows into the first tube portion; and the controller controls the flow rate changing part to change the gas flow rate that flows in based on the gas flow rate detected by the flow rate detecting part.

10. An arc resistance performance evaluation method using the arc resistance performance evaluation device according to claim 9, the method comprising:

determining whether or not pressure inside at least one of the first tube portion and the second tube portion is in a constant state;

determining whether or not the gas flow rate that flows into the first tube portion is in a constant state;

setting the testing subject installing pedestal installed with the testing subject at the reference position when determined that the pressure is in the constant state and the gas flow rate is in the constant state.

11. An arc resistance performance evaluation method using the arc resistance performance evaluation device according to claim 8, the method comprising:

determining whether or not pressure inside at least one of the first tube portion and the second tube portion is in a constant state; and setting the testing subject installing pedestal installed with the testing subject at the reference position when determined that the pressure is in the constant state.

12. The arc resistance performance evaluation device according to claim 1, further comprising:

a power detection unit for detecting power supplied to the induction coil;

a power changing unit for changing power supplied to the induction coil; and a controller for controlling the power changing unit to change the power supplied to the induction coil based on the power detected by the power detection unit.

13. An arc resistance performance evaluation method using the arc resistance performance evaluation device according to claim 12, the method comprising;

determining whether or not power supplied to the induction coil is in a constant state; and setting the testing subject installing pedestal installed with the testing subject at the reference position when determined that the power is in the constant state.

14. An arc resistance performance evaluation system comprising:

the arc resistance performance evaluation device according to claim 1; and a photographing section, which is installed on the outer side of the second tube portion and configured to observe the inside of the second tube portion through the window, wherein the photographing section photographs an ablated vapor generated from the testing subject through the window to acquire photographed data with the testing subject installed on the testing subject installing pedestal irradiated with the plasma generated by the high frequency induction thermal plasma generation unit.

15. The arc resistance performance evaluation system according to claim 14, further comprising an analysis processing section for analyzing a composition of the ablated vapor by performing spectrometric observation processing based on the photographed data.

16. The arc resistance performance evaluation system according to claim 15, wherein the analysis processing section is configured to calculate a rotation temperature and a vibration temperature of a molecule configuring the ablated vapor by fitting based on the result of the spectrometric observation processing.

17. The arc resistance performance evaluation system according to claim 16, wherein the analysis processing section comprises: a spectroscope to calculate a spectral shape based on the photographed data; an input part to input the rotation temperature or the vibration temperature; a memory part to memorize basic data to calculate the spectral shape; an operation part to calculate the spectral shape based on the rotation temperature or the vibration temperature inputted at the input part and the basic data memorized at the memory part; and a display part to display superimposing a spectral shape calculated at the spectroscope and a spectral shape calculated at the operation part.

18. An arc resistance performance evaluation method using the arc resistance performance evaluation device according to claim 1, the method comprising:
supplying high frequency power to the induction coil with a predetermined gas flowed in from the gas flow-in portion to express a desired plasma state;
setting the testing subject installing pedestal, on which the testing subject is installed, at the reference position under the desired plasma state;
photographing an ablated vapor generated from the testing subject through the window from an outer side of the second tube portion to acquire photographed data with the testing subject installed on the testing subject installing pedestal irradiated with the plasma generated in the high frequency induction thermal plasma generation unit; and
obtaining at least one piece of information among whether or not the ablated vapor is generated from the testing subject after a predetermined time from the setting at the reference position, a time required until the start of generation of the ablated vapor from the setting at the reference position, and a molecular composition configuring the ablated vapor based on the photographed data.

19. The arc resistance performance evaluation method according to claim 18, wherein a spectrometric observation processing is performed on the photographed data to perform composition analysis of the ablated vapor.

20. The arc resistance performance evaluation method according to claim 19, wherein the rotation temperature and the vibration temperature of the molecule configuring the ablated vapor are calculated by performing fitting based on the result of the spectrometric observation processing, and compared with a plasma temperature in the plasma state.

21. The arc resistance performance evaluation method according to claim 20, comprising: calculating an analyzed spectral shape based on the photographed data; inputting the rotation temperature or the vibration temperature; calculating a theoretical spectral shape based on the rotation temperature or the vibration temperature inputted; and displaying superimposition of the analyzed spectral shape and the theoretical spectral shape.

22. The arc resistance performance evaluation method according to claim 18, wherein a mass difference between after elapse of a predetermined time from the setting at the reference position of the testing subject installing pedestal on which the testing subject is installed under the desired plasma state, and before exposing under the desired plasma state is compared to measure a mass wear amount of the testing subject.

* * * * *